(12) United States Patent
Meng

(10) Patent No.: US 12,446,430 B2
(45) Date of Patent: Oct. 14, 2025

(54) DISPLAY PANEL WITH DUMMY PIXEL SPACE, DISPLAY DEVICE AND DISPLAY DRIVING METHOD

(71) Applicants: Beijing BOE Optoelectronics Technology Co., Ltd., Beijing (CN); BOE Technology Group Co., Ltd., Beijing (CN)

(72) Inventor: Zhaohui Meng, Beijing (CN)

(73) Assignees: Beijing BOE Optoelectronics Technology Co., Ltd., Beijing (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 17/772,477

(22) PCT Filed: Jul. 27, 2021

(86) PCT No.: PCT/CN2021/108617
§ 371 (c)(1),
(2) Date: Apr. 27, 2022

(87) PCT Pub. No.: WO2023/004574
PCT Pub. Date: Feb. 2, 2023

(65) Prior Publication Data
US 2024/0306460 A1    Sep. 12, 2024

(51) Int. Cl.
*G09G 3/20* (2006.01)
*G09G 3/3208* (2016.01)
*H10K 59/35* (2023.01)

(52) U.S. Cl.
CPC ......... *H10K 59/353* (2023.02); *G09G 3/2074* (2013.01); *G09G 3/3208* (2013.01);
(Continued)

(58) Field of Classification Search
CPC .................................................. G09G 3/2074
See application file for complete search history.

(56) References Cited

U.S. PATENT DOCUMENTS

2010/0156954 A1* 6/2010 Kim ..................... G09G 3/3688
345/690
2018/0366052 A1   12/2018 Shi
(Continued)

FOREIGN PATENT DOCUMENTS

| CN | 103247254 A | 8/2013 |
| CN | 103544901 A | 1/2014 |

(Continued)

OTHER PUBLICATIONS

CN 202180001991.3 first office action dated Nov. 8, 2024.

*Primary Examiner* — William Boddie
*Assistant Examiner* — Andrew B Schnirel
(74) *Attorney, Agent, or Firm* — IPro, PLLC

(57) ABSTRACT

The present disclosure provides a display panel, a display device and a display driving method. The display panel includes a first display region and a second display region each including a plurality of pixel repeat units. Each pixel repeat unit includes a first sub-pixel in a first color, a second sub-pixel in a second color, a third sub-pixel in a third color and a fourth sub-pixel in the first color. A light-emitting area of each of the first sub-pixel and the fourth sub-pixel is smaller than that of the second sub-pixel or the third sub-pixel. A dummy pixel space is formed in a second pixel row between a first pixel repeat unit in a first pixel row and a second pixel repeat unit in a third pixel row in three adjacent pixel rows at the second display region.

13 Claims, 4 Drawing Sheets

(52) U.S. Cl.
CPC ............... *G09G 2300/0413* (2013.01); *G09G 2300/0452* (2013.01); *G09G 2320/0233* (2013.01); *H10K 59/351* (2023.02); *H10K 59/352* (2023.02)

(56) References Cited

U.S. PATENT DOCUMENTS

| | | | | |
|---|---|---|---|---|
| 2020/0119107 | A1* | 4/2020 | Liu | H10K 59/353 |
| 2020/0168674 | A1* | 5/2020 | Tan | G02F 1/1333 |
| 2020/0203450 | A1* | 6/2020 | Lou | G02F 1/133 |
| 2020/0312832 | A1* | 10/2020 | Chi | H10K 59/131 |
| 2021/0035484 | A1* | 2/2021 | Matsueda | G09G 3/2003 |
| 2021/0050389 | A1* | 2/2021 | Yang | H01L 27/1214 |
| 2021/0241671 | A1* | 8/2021 | Lee | G09G 3/2003 |
| 2021/0335297 | A1* | 10/2021 | Huangfu | G09G 3/2003 |
| 2021/0407369 | A1 | 12/2021 | Li | |

FOREIGN PATENT DOCUMENTS

| | | |
|---|---|---|
| CN | 103778888 A | 5/2014 |
| CN | 107479766 A | 12/2017 |
| CN | 208507679 U | 2/2019 |
| CN | 109962092 A | 7/2019 |
| CN | 110021646 A | 7/2019 |
| CN | 110137212 A | 8/2019 |
| CN | 110599954 A | 12/2019 |
| CN | 110603578 A | 12/2019 |
| CN | 110945582 A | 3/2020 |
| CN | 111933679 A | 11/2020 |
| CN | 111951727 A | 11/2020 |
| CN | 112002748 A | 11/2020 |
| JP | 2021026220 A | 2/2021 |
| WO | 2012176580 A1 | 12/2012 |

\* cited by examiner

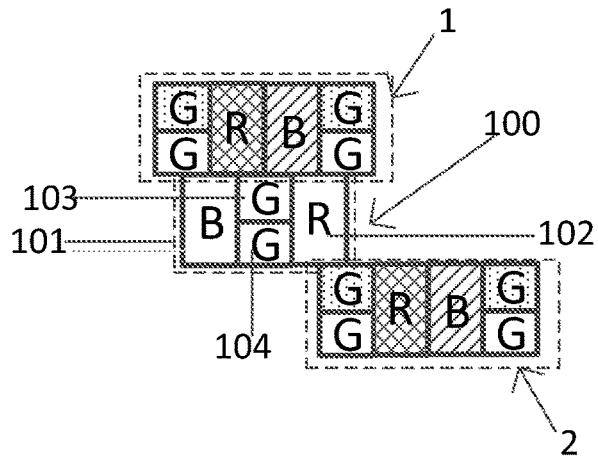

Fig. 6

| receiving a row scanning signal on a target driving row when an image is inputted | S710 |

| inputting a data signal to at least two adjacent pixel rows corresponding to the target driving row in response to the row scanning signal, a part of sub-pixels in the pixel repeat units in one of the at least two adjacent pixel rows and a part of sub-pixels in the pixel repeat units in an adjacent pixel row being enabled in response to the row scanning signal to form dummy display pixels | S720 |

Fig. 7

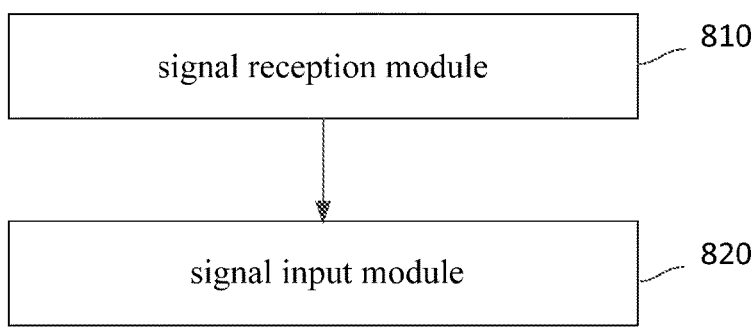

Fig. 8

DISPLAY PANEL WITH DUMMY PIXEL SPACE, DISPLAY DEVICE AND DISPLAY DRIVING METHOD

CROSS-REFERENCE TO RELATED APPLICATION

This application is the U.S. national phase of PCT Application No. PCT/CN2021/108617 filed on Jul. 27, 2021, which is incorporated herein by reference in its entirety.

TECHNICAL FIELD

The present disclosure relates to the field of display technology, in particular to a display panel, a display device, and a display driving method.

BACKGROUND

Most of modern consumer electronic devices are equipped with Liquid Crystal Display (LCD) panels or Organic Light-Emitting Diode (OLED) display panels as man-machine interfaces. Each display panel includes a pixel element array. Usually, based on electronic data generated in accordance with an original image, the image is divided into regions with a same quantity of pixels, and the total quantity of pixels is equal to the quantity of pixel elements on the display panel. Along with an increase in the demand of display screens, especially mobile phone display screens, there is such a trend to provide a current display panel with an under-screen camera module.

For the display panel with the under-screen camera module, a display region corresponding to the under-screen camera module is capable of displaying an image when the display panel is in a display state, so as to provide a full-screen display effect. When the display panel is not in the display state, the display region corresponding to the under-screen camera module is transparent to allow external ambient light to pass therethrough, so as to facilitate the image collection by the camera module.

At present, in order to enable the display region corresponding to the under-screen camera module to satisfy the above-mentioned display effects, the quantity of pixels is usually reduced on the display region. However, based on this structure, a density of pixel units at the display region is less than a density of pixel units at a normal display region. At this time, a resolution at the display region is less than a resolution at the normal display region, thereby the display effect may be adversely affected.

SUMMARY

An object of the present disclosure is to provide a display panel, a display device and a display driving method, so as to ensure a display effect while satisfying the requirement on a light transmittance at a display region corresponding to an under-screen camera module.

In one aspect, the present disclosure provides in some embodiments a display panel, including a first display region and a second display region. The first display region is provided with a first pixel density, and the second display region is provided with a second pixel density smaller than the first pixel density. Each of the first display region and the second display region includes a plurality of pixel repeat units, and each pixel repeat unit includes a first sub-pixel in a first color, a second sub-pixel in a second color, a third sub-pixel in a third color and a fourth sub-pixel in the first color sequentially arranged along a first direction. A light-emitting area of the first sub-pixel in the first color and a light-emitting area of the fourth sub-pixel in the first color are both smaller than a light-emitting area of the second sub-pixel in the second color and a light-emitting area of the third sub-pixel in the third color. A dummy pixel space is formed in a second pixel row between a first pixel repeat unit in a first pixel row and a second pixel repeat unit in a third pixel row in three adjacent pixel rows at the second display region, an area of the dummy pixel space is at least greater than or equal to an area occupied by one pixel repeat unit, and a lengthwise extension direction of the pixel row is parallel to the first direction.

In a possible embodiment of the present disclosure, in three adjacent pixel repeat units at the first display region, the first sub-pixel in the first color of a second pixel repeat unit and the fourth sub-pixel in the first color of a first pixel repeat unit are arranged along a second direction, the fourth sub-pixel in the first color of the second pixel repeat unit and the first sub-pixel in the first color of a third pixel repeat unit are arranged along the second direction, the second direction is perpendicular to the first direction, and the first pixel repeat unit, the second pixel repeat unit and the third pixel repeat unit are sequentially arranged along the first direction.

In a possible embodiment of the present disclosure, a plurality of pixel repeat units is arranged in a staggered manner in two adjacent pixel rows at the second display region.

In a possible embodiment of the present disclosure, widths of the first sub-pixel, the second sub-pixel, the third sub-pixel and the fourth sub-pixel are all L in the first direction, a distance between two adjacent pixel repeat units in the first direction is an integral multiple of L in each pixel row at the second display region, and a distance between two adjacent pixel repeat units in the first direction is an integral multiple of 3 L in a second pixel row of three adjacent pixel rows at the second display region.

In a possible embodiment of the present disclosure, an orthogonal projection of the first pixel repeat unit onto the third pixel row at least partially overlaps the second pixel repeat unit.

In a possible embodiment of the present disclosure, a width of the first sub-pixel and a width of the fourth sub-pixel in the second direction are one half of a width of the second sub-pixel and a width of the third sub-pixel in the second direction respectively in each pixel repeat unit.

In a possible embodiment of the present disclosure, the first sub-pixel and the fourth sub-pixel of each pixel repeat unit are both arranged at a side adjacent to a first edge of the second display region coupled to the first display region, the second display region further includes a second edge coupled to the first display region and arranged opposite to the first edge, and a direction from the first edge to the second edge is parallel to the second direction.

In a possible embodiment of the present disclosure, the sub-pixels in two adjacent pixel rows are arranged in a staggered manner at the first display region and the second display region.

In a possible embodiment of the present disclosure, the first sub-pixel in the first color of a fourth pixel repeat unit in a first pixel row of two adjacent pixel rows at the first display region is offset by 1.5 sub-pixels in the first direction relative to the first sub-pixel in the first color of a fifth pixel repeat unit in the second pixel row adjacent to the fourth pixel repeat unit.

In a possible embodiment of the present disclosure, in a plurality of pixel repeat units, the first sub-pixels and the fourth sub-pixels in a same pixel row are coupled to a first driving line, and the second sub-pixels and the third sub-pixels in a same pixel row are coupled to a second driving line adjacent to the first driving line.

In a possible embodiment of the present disclosure, the first color is green, the second color is red, and the third color is blue.

In another aspect, the present disclosure provides in some embodiments a display device including the above-mentioned display panel.

In yet another aspect, the present disclosure provides in some embodiments a display driving method for the above-mentioned display device, including: receiving a row scanning signal on a target driving row when an image is inputted; and inputting a data signal to at least two adjacent pixel rows corresponding to the target driving row in response to the row scanning signal. A part of sub-pixels in the pixel repeat units in one of the at least two adjacent pixel rows and a part of sub-pixels in the pixel repeat units in an adjacent pixel row are enabled in response to the row scanning signal to form dummy display pixels, and at least a part of the dummy display pixels formed in response to the row scanning signal are located in the dummy pixel space at the second display region.

In a possible embodiment of the present disclosure, when the data signal is inputted to the at least two adjacent pixel rows corresponding to the target driving row, two adjacent dummy display pixels enabled in response to the row scanning signal in a pixel row direction share the second sub-pixel in the second color and the third sub-pixel in the third color in a same pixel repeat unit.

In a possible embodiment of the present disclosure, a relationship between the dummy display pixels enabled in response to the row scanning signal and the sub-pixels of the pixel repeat units is expressed as $G_{i,j}=g_{i,j}$, $G_{i+1,j}=g_{i+1,j}$, $$R_{i,j} = \left(\frac{r_{i,j-2}^\gamma + r_{i,j}^\gamma}{2}\right)^{\frac{1}{\gamma}}, B_{i+2,j} = \left(\frac{b_{i,j+2}^\gamma + b_{i+2,j}^\gamma}{2}\right)^{\frac{1}{\gamma}},$$

$G_{i+2,j}=g_{i+2,j}$, $G_{i+2,j+2}$, $g_{i+2,j+2}$, $$B_{i,j+2} = \left(\frac{b_{i,j+2}^\gamma + b_{i,j+2}^\gamma}{2}\right)^{\frac{1}{\gamma}}, \text{ and } R_{i+2,j-2} = \left(\frac{r_{i-2,j}^\gamma + r_{i+2,j-2}^\gamma}{2}\right)^{\frac{1}{\gamma}},$$

where $G_{i,j}$ and $R_{i,j}$ are grayscale values of a first color sub-pixel and a second color sub-pixel of a dummy display pixel in an $i^{th}$ row and a $j^{th}$ column respectively, $G_{i+1,j}$ is a grayscale value of a first color sub-pixel of a dummy display pixel in an $(i+1)^{th}$ row and the $j^{th}$ column, $B_{i,j+2}$ is a grayscale value of a third color sub-pixel of a dummy display pixel in an $(i+2)^{th}$ row and the $j^{th}$ column, $G_{i+2,j}$ is a grayscale value of a first color sub-pixel of the dummy display pixel in the $(i+2)^{th}$ row and the $j^{th}$ column, $B_{i,j+2}$ is a grayscale value of a third color sub-pixel of a dummy display pixel in the $i^{th}$ row and a $(j+2)^{th}$ column, $G_{i+2,j+2}$ is a grayscale value of a first color sub-pixel of a dummy display pixel in the $(i+2)^{th}$ row and the $(j+2)^{th}$ column, $R_{i+2,j-2}$ is a grayscale value of a second color sub-pixel of a dummy display pixels of the $(i+2)^{th}$ row and a $(j-2)^{th}$ column, $g_{i,j}$ is a grayscale value of first color sub-pixels of a plurality of pixel repeat units in the $i^{th}$ row and the $j^{th}$ column, $g_{i+1,j}$ is a grayscale value of first color sub-pixels of a plurality of pixel repeat units in the $(i+1)^{th}$ row and the $j^{th}$ column, $r_{i,j-2}$ is a grayscale value of second color sub-pixels of a plurality of pixel repeat units in the $i^{th}$ row and the $(j-2)^{th}$ column, $r_{i,j}$ is a grayscale value of second color sub-pixels of a plurality of pixel repeat units in the $i^{th}$ row and the $j^{th}$ column, $b_{i,j+2}$ is a grayscale value of third color sub-pixels of a plurality of pixel repeat units in the $i^{th}$ row and the $(j+2)^{th}$ column, $b_{i+2,j}$ is a grayscale value of third color sub-pixels of a plurality of pixel repeat units in the $(i+2)^{th}$ row and the $j^{th}$ column, $g_{i+2,j}$ is a grayscale value of first color sub-pixels of a plurality of pixel repeat units in the $(i+2)^{th}$ row and the $j^{th}$ column, $g_{i+2,j+2}$ is a grayscale value of first color sub-pixels of a plurality of pixel repeat units in the $(i+2)^{th}$ row and the $(j+2)^{th}$ column, $b_{i-2,j}$ is a grayscale value of third color sub-pixels of a plurality of pixel repeat units in an $(i-2)^{th}$ row and the $j^{th}$ column, $r_{i-2,j}$ is a grayscale value of second color sub-pixels of a plurality of pixel repeat units in the $(i-2)^{th}$ row and the $j^{th}$ column, $r_{i+2,j-2}$ is a grayscale value of second color sub-pixels of a plurality of pixel repeat units in the $(i+2)^{th}$ row and the $(j-2)^{th}$ column, and $\gamma$ is a preset grayscale function.

In still yet another aspect, the present disclosure provides in some embodiments a display driving device for the above-mentioned display device, including: a signal reception module configured to receive a row scanning signal on a target driving row when an image is inputted; and a signal input module configured to input a data signal to at least two adjacent pixel rows corresponding to the target driving row in response to the row scanning signal. A part of sub-pixels in the pixel repeat units in one of the at least two adjacent pixel rows and a part of sub-pixels in the pixel repeat units in an adjacent pixel row are enabled in response to the row scanning signal to form dummy display pixels, and at least a part of the dummy display pixels formed in response to the row scanning signal are located in the dummy pixel space at the second display region.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

FIG. 6 is another schematic view of the dummy pixel according to one embodiment of the present disclosure:

FIG. 7 is a flow chart of a display driving method according to one embodiment of the present disclosure; and FIG. 8 is a schematic view of a display driving device according to one embodiment of the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, for a display panel with an under-screen camera, in order to meet the requirement on light transmittance, the quantity of pixels is reduced at a display region corresponding to the camera as compared with a normal display region. At this time, a resolution at the display region corresponding to the camera is smaller than a resolution at the normal display region, and thereby a display effect will be adversely affected. An object of the present disclosure is to provide a display panel and a display driving method, so as to, through designing a pixel structure at the display region corresponding to the camera and providing a corresponding Sub-Pixel Rendering (SPR) technology, provide a display effect at the display region approaching to that at the normal display region while ensuring a maximum light transmittance at the display region.

Figure 1:
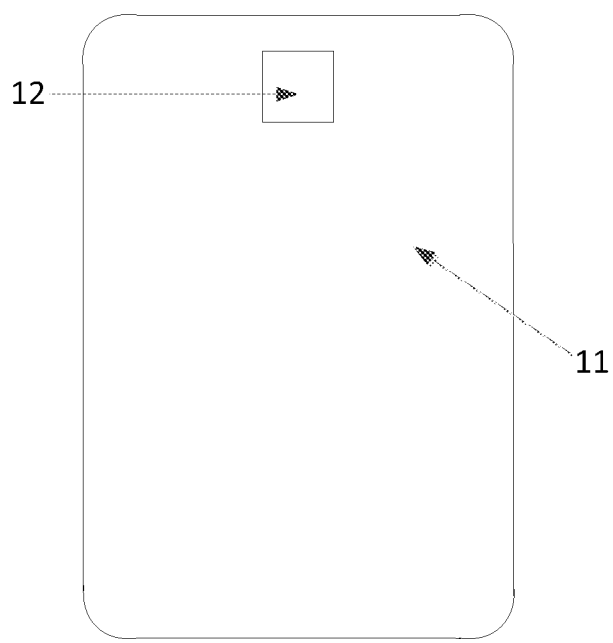
FIG. 1 is a planar view of a display panel according to one embodiment of the present disclosure.

As shown in FIG. 1, the present disclosure provides in some embodiments a display panel, which includes a first display region 11 and a second display region 12 adjacent to each other.

The second display region 12 is formed as a transparent display region. When the display panel is mounted on an electronic device, a photosensitive element such as a camera is provided in an interior of the electronic device at a position corresponding to the second display region 12, so as to collect images through the second display region 12, i.e., an under-screen camera structure is formed.

In a possible embodiment of the present disclosure, the first display region 11 is arranged in such a manner as to surround the second display region 12, and the first display region 11 and the second display region 12 are combined to form an entire display region of the display panel. In a possible embodiment of the present disclosure, the entire display region of the display panel is a transparent display region, or only the second display region 12 is a transparent display region, so as to facilitate the image collection by the under-screen camera. In a possible embodiment of the present disclosure, the display panel is an OLED display panel.

Figure 2:
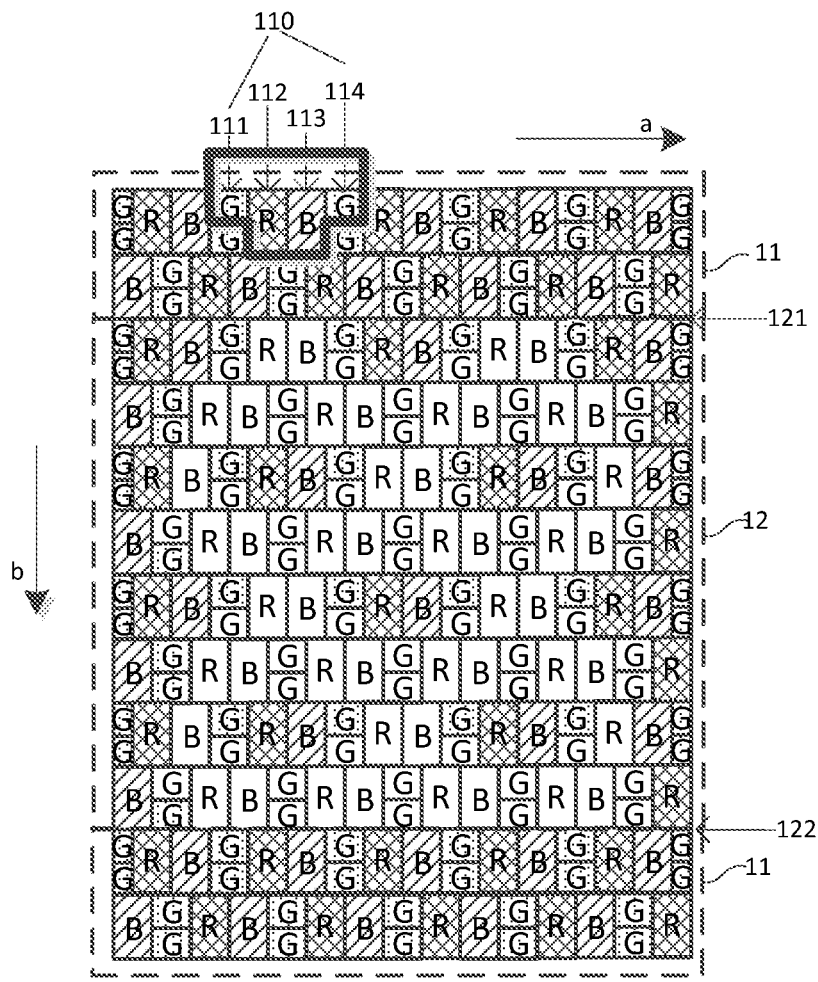
FIG. 2 is a sectional view of the display panel according to one embodiment of the present disclosure.
Figure 3:
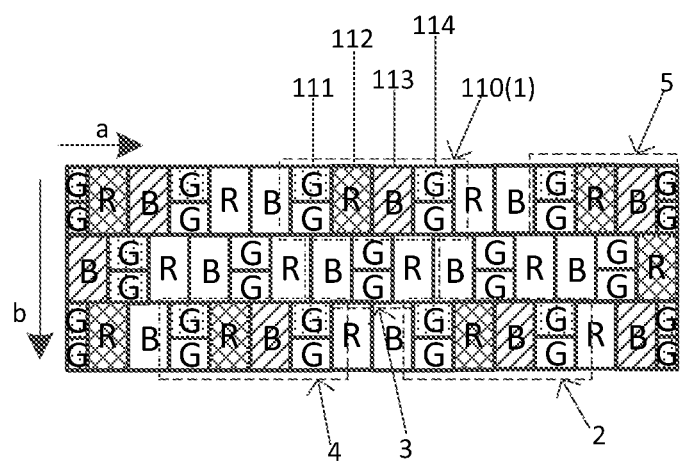
FIG. 3 is a topical schematic view of the display panel in FIG. 2.

As shown in FIGS. 2 and 3, the first display region 11 is provided with a first pixel density, and the second display region 12 is provided with a second pixel density smaller than the first pixel density.

Each of the first display region 11 and the second display region 12 includes a plurality of pixel repeat units 110, and each pixel repeat unit 110 includes a first sub-pixel 111 in a first color, a second sub-pixel 112 in a second color, a third sub-pixel 113 in a third color and a fourth sub-pixel 114 in the first color sequentially arranged along a first direction a. A light-emitting area of the first sub-pixel 111 in the first color and a light-emitting area of the fourth sub-pixel 114 in the first color are both smaller than a light-emitting area of the second sub-pixel 112 in the second color and a light-emitting area of the third sub-pixel 113 in the third color.

A dummy pixel space 3 is formed in a second pixel row between a first pixel repeat unit 1 in a first pixel row and a second pixel repeat unit 2 in a third pixel row in three adjacent pixel rows at the second display region 12, an area of the dummy pixel space 3 is at least greater than or equal to an area occupied by one pixel repeat unit 110, and a lengthwise extension direction of the pixel row is parallel to the first direction a.

In a possible embodiment of the present disclosure, the sub-pixels of a plurality of pixel repeat units 110 at the first display region 11 are sequentially coupled to each other, and a plurality of pixel repeat units 110 at the second display region 12 is spaced apart from each other, so as to provide such a structure that the first pixel density at the first display region 11 is greater than the second pixel density at the second display region 12. It should be appreciated that, in FIG. 2, each hatched block at the second display region 12 is an actual sub-pixel, and a plurality of pixel repeat units 110 is formed. Each blank block between the pixel repeat units 110 is not actual sub-pixel, and it is marked with R, G or B so as to show a positional relationship among the pixel repeat units 110.

On the basis of the above-mentioned pixel repeat units 110, among three adjacent pixel rows at the second display region 12, the dummy pixel space is formed in a pixel row between the first pixel repeat unit 1 and the second pixel repeat unit 2 in the other two pixel rows respectively, i.e., there is no actual pixel repeat unit. When an image is to be displayed, a dummy pixel unit is formed at the dummy pixel space through an SPR driving algorithm. In this way, it is able to increase a resolution at the display region corresponding to the camera while ensuring a maximum light transmittance at the display region, and provide the display effect at the second display region approaching to that at a normal display region (the first display region).

Figure 4:
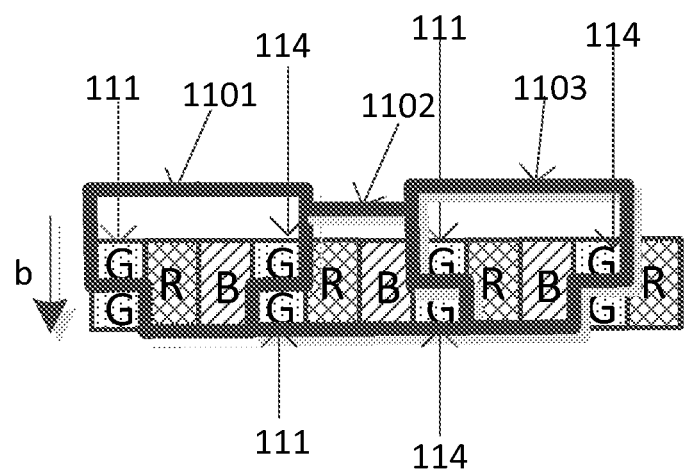
FIG. 4 is a schematic view of a second pixel repeat unit in a second display region.

In a possible embodiment of the present disclosure, as shown in FIGS. 2 and 4, in three adjacent pixel repeat units 110 at the first display region 11, a first sub-pixel 111 in the first color of a second pixel repeat unit 1102 and a fourth sub-pixel 114 in the first color of a first pixel repeat unit 1101 are arranged along a second direction b, the fourth sub-pixel 114 in the first color of the second pixel repeat unit 1102 and the first sub-pixel 111 in the first color of a third pixel repeat unit 1103 are arranged along the second direction b, the second direction b is perpendicular to the first direction a, and the first pixel repeat unit 1101, the second pixel repeat unit 1102 and the third pixel repeat unit 1103 are sequentially arranged along the first direction a.

Based on the above-mentioned structure, in each pixel repeat unit 110, a width of the first sub-pixel 111 and a width of the fourth sub-pixel 114 in the second direction b are one half of a width of the second sub-pixel 112 and a width of the third sub-pixel 113 in the second direction b respectively. Further, in a possible embodiment of the present disclosure, in each pixel repeat unit 110, widths of the first sub-pixel 111, the second sub-pixel 112, the third sub-pixel 113 and the fourth sub-pixel 114 in the first direction a are equal.

Based on the implementation, in the two adjacent pixel repeat units 110 at the first display region 11, after two sub-pixels in the first color of the two adjacent pixel repeat unit 110 are combined and arranged along the second direction b, a total width of these sub-pixels in the second direction is equal to the width of the sub-pixel in the second color and the width of the sub-pixel in the third color in the second direction, and a total area of these sub-pixels is equal to an area of a sub-pixel in the second color or a sub-pixel in the third color.

In a possible embodiment of the present disclosure, the first color is green, the second color is red, and the third color is blue. It should be appreciated that, when the first display region 11 and the second display region 12 are arranged as mentioned hereinabove, the first color, the second color and the third color are not limited to those mentioned hereinabove.

At the first display region 11, a plurality of R, G and B sub-pixels is arranged in sequence, but each G sub-pixel includes two parts arranged along the second direction (namely, a pixel column direction). As compared with the related art, the two parts of the G sub-pixel belong to different pixel repeat units and are driven by different driving lines to emit light. In each pixel repeat unit 110 at the second display region 12, the first sub-pixel 111 and the fourth sub-pixel 114 in the first color are arranged at one side of the second sub-pixel 112 in the second color and one side of the third sub-pixel 113 in the third color respectively. In this regard, each pixel repeat unit 110 at the second display region 12 includes one sub-pixel in the second color, one sub-pixel in the third color and two sub-pixels in the first color.

In a possible embodiment of the present disclosure, as shown in FIGS. 2 and 3, in a same pixel row at the second display region 12, two adjacent pixel repeat units 110 are spaced apart from each other, i.e., no pixel repeat unit is arranged between the two adjacent pixel repeat units 110.

In addition, a plurality of pixel repeat units 110 in two pixel rows is arranged in a staggered manner. Specifically, as shown in FIGS. 2 and 3, in three adjacent pixel rows, an orthogonal projection of the first pixel repeat unit 1 in a first pixel row onto a third pixel row is at least partially located between the second pixel repeat unit 2 and the third pixel repeat unit 4 in the third pixel row. In a possible embodiment of the present disclosure, the orthogonal projection includes a portion located between the second pixel repeat unit 2 and the third pixel repeat unit 4, and further includes a portion overlapping the second pixel repeat unit 2 and a portion overlapping the third pixel repeat unit 4.

Referring to FIGS. 2 and 3, at the second display region 12, a distance between two adjacent pixel repeat units 110 is an integral multiple of a width L of the sub-pixel of the pixel repeat unit 110 in the first direction a, where L is a non-zero natural number.

Specifically, in the first direction a, the widths of the first sub-pixel 111, the second sub-pixel 112, the third sub-pixel 113 and the fourth sub-pixel 114 are all L. In each pixel row at the second display region 12, the distance between the two adjacent pixel repeat units 110 in the first direction a is an integral multiple of L.

In a possible embodiment of the present disclosure, in each pixel row at the second display region 12, the distance between two adjacent pixel repeat units 110 in the first direction a is at least twice of L.

In a possible embodiment of the present disclosure, in the second pixel row, a distance between two adjacent pixel repeat units 110 in the first direction a is an integral multiple of 3 L.

Based on the above-mentioned structure, the dummy pixel space 3 is formed in the second pixel row between the first pixel repeat unit 1 in the first pixel row and the second pixel repeat unit 2 in the third pixel row, and the area of the dummy pixel space 3 is at least greater than or equal to the area occupied by the pixel repeat unit 110.

Further, in the embodiments of the present disclosure, as shown in FIGS. 2 and 3, an orthogonal projection of the first pixel repeat unit 1 onto the third pixel row at least partially overlaps the second pixel repeat unit 2, and an orthogonal projection of the fourth pixel repeat unit 5 on the third pixel row adjacent to the first pixel repeat unit 1 in the first direction a also overlaps the second pixel repeat unit 2. Specifically, for an orthogonal projection of the first pixel repeat unit 1 onto the third pixel row, an orthogonal projection of the fourth sub-pixel in the first color overlaps the first sub-pixel in the first color of the second pixel repeat unit 2. In a possible embodiment of the present disclosure, in the first pixel row, for an orthogonal projection of the fourth pixel repeat unit 5 adjacent to the first pixel repeat unit 1 in the first direction a onto the third pixel row, the orthogonal projection of the first sub-pixel in the first color overlaps the fourth sub-pixel in the first color of the second pixel repeat unit 2.

As shown in FIG. 3, in each pixel repeat unit 110 at the first display region 11 and the second display region 12, the widths of the first sub-pixel 111 and the fourth sub-pixel 114 in the second direction b are one half of the width of the second sub-pixels 112 and the width of the third sub-pixels 113 in the second direction b respectively.

In addition, in a possible embodiment of the present disclosure, as shown in FIG. 2 in conjunction with FIG. 3, the first sub-pixel 111 and the fourth sub-pixel 114 of each pixel repeat unit 110 are both arranged at a side adjacent to a first edge 121 of the second display region 12 coupled to the first display region 11, the second display region 12 further includes a second edge 122 coupled to the first display region 11 and arranged opposite to the first edge 121, and a direction from the first edge 121 to the second edge 122 is parallel to the second direction b.

In other words, specifically, at the second display region 12, for each pixel repeat unit 110, the first sub-pixel 111 and the fourth sub-pixel 114 are arranged close to the first edge 121.

Further, in a possible embodiment of the present disclosure, as shown in FIG. 2, the sub-pixels of two adjacent pixel rows are arranged in a staggered manner at the first display region 11 and the second display region 12.

Specifically, as shown in FIG. 2, at the first display region 11, the sub-pixels in each pixel row and the sub-pixels in an adjacent row are arranged in a staggered manner, i.e., in each pixel row, an orthogonal projection of any sub-pixel onto the adjacent pixel row overlaps at least two adjacent sub-pixels in the adjacent row. Specifically, the first sub-pixel in the first color of a fourth pixel repeat unit 1004 in a first pixel row of two adjacent pixel rows is offset by 1.5 sub-pixels in the first direction relative to the first sub-pixel in the first color of a fifth pixel repeat unit 1105 in the second pixel row adjacent to the fourth pixel repeat unit 1104.

In a plurality of pixel repeat units 110, the first sub-pixels 111 and the fourth sub-pixels 114 in a same pixel row are coupled to a first driving line, and the second sub-pixels 112 and the third sub-pixels 113 in a same pixel row are coupled to a second driving line adjacent to the first driving line. In a possible embodiment of the present disclosure, as shown in FIG. 4, two sub-pixels in the first color in the second direction belong to a same pixel column but belong to different pixel repeat units, and are coupled to different driving lines. For example, for the two sub-pixels in the first color arranged one above another, an upper sub-pixel is coupled to the first driving line, and a lower sub-pixel is coupled to the second driving line. In a possible embodiment of the present disclosure, the first driving line is a previous scanning signal input line of the second driving line.

In a possible embodiment of the present disclosure, when the first color is green, the second color is red and the third color is blue, the G sub-pixels at one side of each of the R sub-pixel and the B sub-pixel are sub-pixels controlled by a previous driving line, and the R sub-pixel and the B sub-pixel are sub-pixels controlled by a current driving line.

Based on the above-mentioned structure, as shown in FIG. 2, at the first display region 11, the plurality of pixel repeat units 110 is coupled to each other in sequence. An SPR algorithm is adopted when driving, and the two G sub-pixels arranged in sequence along the second direction share the R sub-pixel and the B sub-pixel with an adjacent pixel repeat unit 110. Specifically, during the driving, an addressing portion for addressing the dummy pixel unit may include two addressing pixels RG, BG.

In a possible embodiment of the present disclosure, during the driving, the two adjacent G sub-pixels addressed in a previous row are arranged at a right side and a left side of the pixel respectively, and the R and B sub-pixels addressed in a current row are arranged in the middle of the pixel. The G sub-pixel in the current row is not enabled. That is, the two G sub-pixels are controlled by the previous driving line, the R sub-pixel and the B sub-pixel in the current row are arranged in the middle of the pixel, and the G sub-pixel controlled by the current driving line is not enabled.

At the first display region 11 and the second display region 12, each pixel repeat unit 110 has a structure as shown in FIG. 4. In every three adjacent pixel rows, the first pixel repeat unit 1 in a first pixel row and the second pixel repeat unit 2 in a third pixel row are formed as a group of adjacent pixels, and no pixel is provided between the first pixel repeat unit 1 and the second pixel repeat unit 2, i.e., the dummy pixel space is formed, and thereby a dummy pixel unit is formed through the SPR driving algorithm.

In a possible embodiment of the present disclosure, within a group of adjacent pixel repeat units, distances between centers of two sub-pixels in the second color (the R sub-pixels) of the first pixel repeat unit 1 and the second pixel repeat unit 2 are 30 μm (in an x-axis direction) and 76 μm (in a y-axis direction), and distances between centers of two sub-pixels in the third color (the B sub-pixels) are 30 μm (in the x-axis direction) and 83 μm (in the y-axis direction).

It should be appreciated that, the distance between the sub-pixels is not limited to those mentioned hereinabove, and it may be determined according to an overall size of the display panel, the manufacturing process, the light-emitting requirement, etc.

Figure 5:
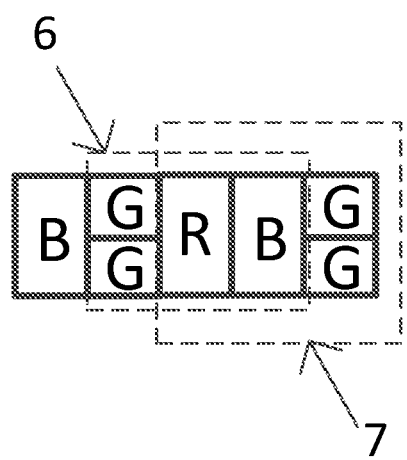
FIG. 5 is a schematic view of a dummy pixel according to one embodiment of the present disclosure.

In a possible embodiment of the present disclosure, at the second display region 12, for the dummy pixel units formed by the plurality of pixel repeat units 110, a dummy pixel unit shares R and B sub-pixels with an adjacent dummy pixel unit. As shown in FIG. 5, a dummy pixel unit 6 and a dummy pixel unit 7 share R and B sub-pixels.

In addition, during the display, the G sub-pixel in each dummy pixel unit is represented as a g signal for an actual pixel unit, and the R sub-pixel and B sub-pixel are represented as an r signal and a b signal for two adjacent actual pixel units respectively.

Specifically, a data signal is inputted to at least two adjacent pixel rows corresponding to a target driving row in accordance with a row scanning signal on the target driving row when an image is inputted, so as to form the dummy pixel unit. For example, referring to FIG. 6, a dummy display pixel 100 is formed through the first pixel repeat unit 1 and the second pixel repeat unit 2. As shown in FIGS. 2 and 3 in conjunction with FIG. 6, in the case of displaying an image at the second display region 12 (a same rule is adopted at the first display region 11), when a pixel is addressed, in each pixel repeat unit 110, the first sub-pixel in the first color, i.e., the G sub-pixel, is used to address the dummy display pixels in a previous row, and the fourth sub-pixel in the first color, i.e., the G sub-pixel, is used to address the dummy display pixels adjacent to the dummy display pixels in the previous row. Based on this arrangement, when image data is inputted at the second display region 12, the dummy pixel space forms the dummy display pixel 100. The SPR driving algorithm adopted for addressing the pixel, i.e., a relationship between the dummy display pixel and the sub-pixel of the pixel repeat unit, is expressed as $G_{i,j}=g_{i,j}$, $G_{i+1,j}=g_{i+1,j}$, $$R_{i,j} = \left(\frac{r^{\gamma}_{i,j-2} + r^{\gamma}_{i,j}}{2}\right)^{\frac{1}{\gamma}}, B_{i+2,j} = \left(\frac{b^{\gamma}_{i,j+2} + b^{\gamma}_{i+2,j}}{2}\right)^{\frac{1}{\gamma}},$$

$G_{i+2,j}=g_{i+2,j}$, $G_{i+2,j+2}=g_{i+2,j+2}$, $$B_{i,j+2} = \left(\frac{b^{\gamma}_{i,j+2} + b^{\gamma}_{i,j+2}}{2}\right)^{\frac{1}{\gamma}}, \text{ and } R_{i+2,j-2} = \left(\frac{r^{\gamma}_{i-2,j} + r^{\gamma}_{i+2,j-2}}{2}\right)^{\frac{1}{\gamma}},$$

where $G_{i,j}$ and $R_{i,j}$ are grayscale values of a first color sub-pixel and a second color sub-pixel of a dummy display pixel in an $i^{th}$ row and a $j^{th}$ column respectively, $G_{i+1,j}$ is a grayscale value of a first color sub-pixel of a dummy display pixel in an $(i+1)^{th}$ row and the $j^{th}$ column, $B_{i+2,j}$ is a grayscale value of a third color sub-pixel of a dummy display pixel in an $(i+2)^{th}$ row and the $j^{th}$ column, $G_{i+2,j}$ is a grayscale value of a first color sub-pixel of the dummy display pixel in the $(i+2)^{th}$ row and the $j^{th}$ column, $B_{i,j+2}$ is a grayscale value of a third color sub-pixel of a dummy display pixel in the $i^{th}$ row and a $(j+2)^{th}$ column, $G_{i+2,j+2}$ is a grayscale value of a first color sub-pixel of a dummy display pixel in the $(i+2)^{th}$ row and the $(j+2)^{th}$ column, $R_{i+2,j-2}$ is a grayscale value of a second color sub-pixel of a dummy display pixels of the $(i+2)^{th}$ row and a $(j-2)^{th}$ column, $g_{i,j}$ is a grayscale value of first color sub-pixels of a plurality of pixel repeat units in the $i^{th}$ row and the $j^{th}$ column, $g_{i+1,j}$ is a grayscale value of first color sub-pixels of a plurality of pixel repeat units in the $(i+1)^{th}$ row and the $j^{th}$ column, $r_{i,j-2}$ is a grayscale value of second color sub-pixels of a plurality of pixel repeat units in the $i^{th}$ row and the $(j-2)^{th}$ column, $r_{i,j}$ is a grayscale value of second color sub-pixels of a plurality of pixel repeat units in the $i^{th}$ row and the $j^{th}$ column, $b_{i,j+2}$ is a grayscale value of third color sub-pixels of a plurality of pixel repeat units in the $i^{th}$ row and the $(j+2)^{th}$ column, $b_{i+2,j}$ is a grayscale value of third color sub-pixels of a plurality of pixel repeat units in the $(i+2)^{th}$ row and the $j^{th}$ column, $g_{i+2,j}$ is a grayscale value of first color sub-pixels of a plurality of pixel repeat units in the $(i+2)^{th}$ row and the $j^{th}$ column, $g_{i+2,j+2}$ is a grayscale value of first color sub-pixels of a plurality of pixel repeat units in the $(i+2)^{th}$ row and the $(j+2)^{th}$ column, $b_{i-2,j}$ is a grayscale value of third color sub-pixels of a plurality of pixel repeat units in an $(i-2)^{th}$ row and the $j^{th}$ column, $r_{i-2,j}$ is a grayscale value of second color sub-pixels of a plurality of pixel repeat units in the $(i-2)^{th}$ row and the $j^{th}$ column, $r_{i+2,j-2}$ is a grayscale value of second color sub-pixels of a plurality of pixel repeat units in the $(i+2)^{th}$ row and the $(j-2)^{th}$ column, and γ is a preset grayscale function. The gray function may be predetermined through experiments.

Based on the above, in at least two adjacent pixel rows, a part of sub-pixels of the pixel repeat unit in one of the pixel rows and a part of sub-pixels of the pixel repeat unit in the adjacent pixel row are enabled in response to the row scanning signal to form the dummy display pixels. To be specific, a sub-pixel in the first color of a dummy display pixel in a first row (the $i^{th}$ row) is formed through a first sub-pixel in the first color of a pixel repeat unit in a first pixel row (the $i^{th}$ row), a sub-pixel in the first color of a dummy display pixel in a second row (the $(i+1)^{th}$ row) is formed through a first sub-pixel in the first color of a pixel repeat unit in a second pixel row (the $(i+1)^{th}$ row), a second sub-pixel in the second color of a dummy display pixel in the first row (the $i^{th}$ row) is formed through a first sub-pixel in the second color of a pixel repeat unit in the first pixel row (the $i^{th}$ row) and a second sub-pixel in the second color of an adjacent pixel repeat unit, a third sub-pixel in the third color of a dummy display pixel in a third row (the $(i+2)^{th}$ row) is formed through a third sub-pixel in the third color of a pixel repeat unit in the first pixel row (the $i^{th}$ row) and a third sub-pixel in the third color of a pixel repeat unit in a third pixel row (the $(i+2)^{th}$ row), a sub-pixel in the first color of a dummy display pixel in the third row (the $(i+2)^{th}$ row) is formed through a first sub-pixel in the first color of a pixel repeat unit in the third pixel row (the $(i+2)^{th}$ row), a third sub-pixel in the third color of a dummy display pixel in the first row (the $i^{th}$ row) is formed through a third sub-pixel in the third color of a pixel repeat unit in a fourth pixel row (the $(i-2)^{th}$ row) and a third sub-pixel in the third color of a pixel repeat unit in the first pixel row (the $i^{th}$ row), and a sub-pixel in the second color of a dummy display pixel in the third row (the $(i+2)^{th}$ row) is formed through a second sub-pixel in the second color of a pixel repeat unit in the fourth pixel row (the $(i-2)^{th}$ row) and a second sub-pixel in the second color of a pixel repeat unit in the third pixel row (the $(i+2)^{th}$ row).

Based on the above, when the data signal is inputted to the at least two adjacent pixel rows corresponding to the target driving line in response to the row scanning signal, different pixel repeat units in at least three adjacent pixel rows form a dummy display pixel.

According to the display panel in the embodiments of the present disclosure, the sub-pixels in the first color are formed non-evenly at the second display region, and a brightness value is adjusted through the sub-pixels in the second color and the sub-pixels in the third color, so as to enable brightness centers of the dummy pixels to be distributed evenly.

In addition, two adjacent pixel repeat units share a sub-pixel in the second color and a sub-pixel in a third color adjacent to each other (e.g., an R sub-pixel or a B sub-pixel), so as to provide additional dummy display pixels on the basis of the common physical pixels. In this regard, two physical pixels visually become three pixel units, i.e., a resolution is 1.5 times of that of a conventional display panel. As a result, it is able to increase the resolution at the second display region corresponding to the camera, and reduce a difference between a display effect at the second display region and a display effect at the first display region.

For example, to increase an aperture ratio at the second display region, a density of the physical pixels at the second display region is one quarter of a density of the pixels at the first display region. When the density of the pixel units of a conventional OLED display panel is 720 p, the density of the pixel units at the second display region is 180 p. Based on the display panel in the embodiments of the present disclosure in conjunction with the SPR driving algorithm, the actual resolution at the second display region is 270 p, so it is able to ensure the display effect and meet the requirement on the light transmittance at the display region corresponding to the under-screen camera module.

The present disclosure further provides in some embodiments a display device including the above-mentioned display panel.

Based on the above description, a person skilled in the art may know the specific structure of the display device including the display panel, which will thus not be particularly defined herein.

The present disclosure further provides in some embodiments a display driving method for the above-mentioned display device which, as shown in FIG. 7, includes: S710 of receiving a row scanning signal on a target driving row when an image is inputted; and S720 of inputting a data signal to at least two adjacent pixel rows corresponding to the target driving row in response to the row scanning signal. A part of sub-pixels in the pixel repeat units in one of the at least two adjacent pixel rows and a part of sub-pixels in the pixel repeat units in an adjacent pixel row are enabled in response to the row scanning signal to form dummy display pixels, and at least a part of the dummy display pixels formed in response to the row scanning signal are located in the dummy pixel space at the second display region.

In a possible embodiment of the present disclosure, in S720, when the data signal is inputted to the at least two adjacent pixel rows corresponding to the target driving row, two adjacent dummy display pixels enabled in response to the row scanning signal in a pixel row direction share the second sub-pixel in the second color and the third sub-pixel in the third color in a same pixel repeat unit.

In a possible embodiment of the present disclosure, in S720, a relationship between the dummy display pixels enabled in response to the row scanning signal and the sub-pixels of the pixel repeat units is expressed as $G_{i,j}=g_{i,j}$, $G_{i+1,j}=g_{i+1,j}$, $$R_{i,j} = \left(\frac{r_{i,j-2}^{\gamma} + r_{i,j}^{\gamma}}{2}\right)^{\frac{1}{\gamma}}, B_{i+2,j} = \left(\frac{b_{i,j+2}^{\gamma} + b_{i+2,j}^{\gamma}}{2}\right)^{\frac{1}{\gamma}},$$

$G_{i+2,j}=g_{i+2,j}$, $G_{i+2,j+2}=g_{i+2,j+2}$, $$B_{i,j+2} = \left(\frac{b_{i,j+2}^{\gamma} + b_{i,j+2}^{\gamma}}{2}\right)^{\frac{1}{\gamma}}, \text{ and } R_{i+2,j-2} = \left(\frac{r_{i-2,j}^{\gamma} + r_{i+2,j-2}^{\gamma}}{2}\right)^{\frac{1}{\gamma}},$$

where $G_{i,j}$ and $R_{i,j}$ are grayscale values of a first color sub-pixel and a second color sub-pixel of a dummy display pixel in an $i^{th}$ row and a $j^{th}$ column respectively, $G_{i+1,j}$ is a grayscale value of a first color sub-pixel of a dummy display pixel in an $(i+1)^{th}$ row and the $j^{th}$ column, $B_{i+2,j}$ is a grayscale value of a third color sub-pixel of a dummy display pixel in an $(i+2)^{th}$ row and the $j^{th}$ column, $G_{i+2,j}$ is a grayscale value of a first color sub-pixel of the dummy display pixel in the $(i+2)^{th}$ row and the $j^{th}$ column, $B_{i,j+2}$ is a grayscale value of a third color sub-pixel of a dummy display pixel in the $i^{th}$ row and a $(j+2)^{th}$ column, $G_{i+2,j+2}$ is a grayscale value of a first color sub-pixel of a dummy display pixel in the $(i+2)^{th}$ row and the $(j+2)^{th}$ column, $R_{i+2,j-2}$ is a grayscale value of a second color sub-pixel of a dummy display pixels of the $(i+2)^{th}$ row and a $(j-2)^{th}$ column, $g_{i,j}$ is a grayscale value of first color sub-pixels of a plurality of pixel repeat units in the $i^{th}$ row and the $j^{th}$ column, $g_{i+1,j}$ is a grayscale value of first color sub-pixels of a plurality of pixel repeat units in the $(i+1)^{th}$ row and the $j^{th}$ column, $r_{i,j-2}$ is a grayscale value of second color sub-pixels of a plurality of pixel repeat units in the $i^{th}$ row and the $(j-2)^{th}$ column, $r_{i,j}$ is a grayscale value of second color sub-pixels of a plurality of pixel repeat units in the $i^{th}$ row and the $j^{th}$ column, $b_{i,j+2}$ is a grayscale value of third color sub-pixels of a plurality of pixel repeat units in the $i^{th}$ row and the $(j+2)^{th}$ column, $b_{i+2,j}$ is a grayscale value of third color sub-pixels of a plurality of pixel repeat units in the $(i+2)^{th}$ row and the $j^{th}$ column, $g_{i+2,j}$ is a grayscale value of first color sub-pixels of a plurality of pixel repeat units in the $(i+2)^{th}$ row and the $j^{th}$ column, $g_{i+2,j+2}$ is a grayscale value of first color sub-pixels of a plurality of pixel repeat units in the $(i+2)^{th}$ row and the $(j+2)^{th}$ column, $b_{i-2,j}$ is a grayscale value of third color sub-pixels of a plurality of pixel repeat units in an $(i-2)^{th}$ row and the $j^{th}$ column, $r_{i-2,j}$ is a grayscale value of second color sub-pixels of a plurality of pixel repeat units in the (i−2)$^{th}$ row and the j$^{th}$ column, r$_{i+2,j−2}$ is a grayscale value of second color sub-pixels of a plurality of pixel repeat units in the (i+2)$^{th}$ row and the (j−2)$^{th}$ column, and γ is a preset grayscale function.

The present disclosure further provides in some embodiments a display driving device for the above-mentioned display device which, as shown in FIG. 8, includes: a signal reception module 810 configured to receive a row scanning signal on a target driving row when an image is inputted; and a signal input module 820 configured to input a data signal to at least two adjacent pixel rows corresponding to the target driving row in response to the row scanning signal. A part of sub-pixels in the pixel repeat units in one of the at least two adjacent pixel rows and a part of sub-pixels in the pixel repeat units in an adjacent pixel row are enabled in response to the row scanning signal to form dummy display pixels, and at least a part of the dummy display pixels formed in response to the row scanning signal are located in the dummy pixel space at the second display region.

In a possible embodiment of the present disclosure, when the data signal is inputted by the signal input module 820 to the at least two adjacent pixel rows corresponding to the target driving row, two adjacent dummy display pixels enabled in response to the row scanning signal in a pixel row direction share the second sub-pixel in the second color and the third sub-pixel in the third color in a same pixel repeat unit.

In a possible embodiment of the present disclosure, a relationship between the dummy display pixels enabled in response to the row scanning signal and the sub-pixels of the pixel repeat units is expressed as $G_{i,j}=g_{i,j}$, $G_{i+1,j}=g_{i+1,j}$, $$R_{i,j} = \left(\frac{r_{i,j-2}^\gamma + r_{i,j}^\gamma}{2}\right)^{\frac{1}{\gamma}}, B_{i+2,j} = \left(\frac{b_{i,j+2}^\gamma + b_{i+2,j}^\gamma}{2}\right)^{\frac{1}{\gamma}},$$

$G_{i+2,j}=g_{i+2,j}$, $G_{i+2,j+2}=g_{i+2,j+2}$, $$B_{i,j+2} = \left(\frac{b_{i,j+2}^\gamma + b_{i,j+2}^\gamma}{2}\right)^{\frac{1}{\gamma}}, \text{ and } R_{i+2,j-2} = \left(\frac{r_{i-2,j}^\gamma + r_{i+2,j-2}^\gamma}{2}\right)^{\frac{1}{\gamma}},$$

where $G_{i,j}$ and $R_{i,j}$ are grayscale values of a first color sub-pixel and a second color sub-pixel of a dummy display pixel in an i$^{th}$ row and a j$^{th}$ column respectively, $G_{i+1,j}$ is a grayscale value of a first color sub-pixel of a dummy display pixel in an (i+1)$^{th}$ row and the j$^{th}$ column, $B_{i+2,j}$ is a grayscale value of a third color sub-pixel of a dummy display pixel in an (i+2)$^{th}$ row and the j$^{th}$ column, $G_{i+2,j}$ is a grayscale value of a first color sub-pixel of the dummy display pixel in the (i+2)$^{th}$ row and the j$^{th}$ column, $B_{i,j+2}$ is a grayscale value of a third color sub-pixel of a dummy display pixel in the i$^{th}$ row and a (j+2)$^{th}$ column, $G_{i+2,j+2}$ is a grayscale value of a first color sub-pixel of a dummy display pixel in the (i+2)$^{th}$ row and the (j+2)$^{th}$ column, $R_{i+2,j-2}$ is a grayscale value of a second color sub-pixel of a dummy display pixels of the (i+2)$^{th}$ row and a (j−2)$^{th}$ column, $g_{i,j}$ is a grayscale value of first color sub-pixels of a plurality of pixel repeat units in the i$^{th}$ row and the j$^{th}$ column, $g_{i+1,j}$ is a grayscale value of first color sub-pixels of a plurality of pixel repeat units in the (i+1)$^{th}$ row and the j$^{th}$ column, $r_{i,j-2}$ is a grayscale value of second color sub-pixels of a plurality of pixel repeat units in the i$^{th}$ row and the (j−2)$^{th}$ column, $r_{i,j}$ is a grayscale value of second color sub-pixels of a plurality of pixel repeat units in the i$^{th}$ row and the j$^{th}$ column, $b_{i,j+2}$ is a grayscale value of third color sub-pixels of a plurality of pixel repeat units in the i$^{th}$ row and the (j+2)$^{th}$ column, $b_{i+2,j}$ is a grayscale value of third color sub-pixels of a plurality of pixel repeat units in the (i+2)$^{th}$ row and the j$^{th}$ column, $g_{i+2,j}$ is a grayscale value of first color sub-pixels of a plurality of pixel repeat units in the (i+2)$^{th}$ row and the j$^{th}$ column, $g_{i+2,j+2}$ is a grayscale value of first color sub-pixels of a plurality of pixel repeat units in the (i+2)$^{th}$ row and the (j+2)$^{th}$ column, $b_{i-2,j}$ is a grayscale value of third color sub-pixels of a plurality of pixel repeat units in an (i−2)$^{th}$ row and the j$^{th}$ column, $r_{i-2,j}$ is a grayscale value of second color sub-pixels of a plurality of pixel repeat units in the (i−2)$^{th}$ row and the j$^{th}$ column, $r_{i+2,j-2}$ is a grayscale value of second color sub-pixels of a plurality of pixel repeat units in the (i+2)$^{th}$ row and the (j−2)$^{th}$ column, and γ is a preset grayscale function.

According to the display panel, the display driving method and the display driving device in the embodiments of the present disclosure, it is able to increase the actual resolution at the second display region, thereby to improve the display effect at the display region corresponding to the under-screen camera module while meeting the requirement on the light transmittance at the display region.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display driving method for a display device, wherein the display device comprises a display panel, wherein the display panel comprises a first display region and a second display region, wherein the first display region is provided with a first pixel density, and the second display region is provided with a second pixel density smaller than the first pixel density;

each of the first display region and the second display region comprises a plurality of pixel repeat units, and each pixel repeat unit comprises a first sub-pixel in a first color, a second sub-pixel in a second color, a third sub-pixel in a third color and a fourth sub-pixel in the first color sequentially arranged along a first direction;

a light-emitting area of the first sub-pixel in the first color and a light-emitting area of the fourth sub-pixel in the first color are both smaller than a light-emitting area of the second sub-pixel in the second color and a light-emitting area of the third sub-pixel in the third color; and a dummy pixel space is formed in a second pixel row between a first pixel repeat unit in a first pixel row and a second pixel repeat unit in a third pixel row in three adjacent pixel rows at the second display region, an area of the dummy pixel space is at least greater than or equal to an area occupied by one pixel repeat unit, and a lengthwise extension direction of the pixel row is parallel to the first direction;

wherein the method comprises:

receiving a row scanning signal on a target driving row when an image is inputted; and inputting a data signal to at least two adjacent pixel rows corresponding to the target driving row in response to the row scanning signal, wherein a part of sub-pixels in the pixel repeat units in one of the at least two adjacent pixel rows and a part of sub-pixels in the pixel repeat units in an adjacent pixel row are enabled in response to the row scanning signal to form dummy display pixels, and at least a part of the dummy display pixels formed in response to the row scanning signal are located in the dummy pixel space at the second display region;

wherein a relationship between the dummy display pixels enabled in response to the row scanning signal and the sub-pixels of the pixel repeat units is expressed as $G_{i,j}=g_{i,j}$, $$R_{i,j} = \left(\frac{r^\gamma_{i,j-2} + r^\gamma_{i,j}}{2}\right)^{\frac{1}{\gamma}}, B_{i+2,j} = \left(\frac{b^\gamma_{i,j+2} + b^\gamma_{i+2,j}}{2}\right)^{\frac{1}{\gamma}},$$

$G_{i+2,j}=g_{i+2,j}$, $G_{i+2,j+2}=g_{i+2,j+2}$, $$B_{i,j+2} = \left(\frac{b^\gamma_{i,j+2} + b^\gamma_{i,j+2}}{2}\right)^{\frac{1}{\gamma}}, \text{ and } R_{i+2,j-2} = \left(\frac{r^\gamma_{i-2,j} + r^\gamma_{i+2,j-2}}{2}\right)^{\frac{1}{\gamma}},$$

wherein $G_{i,j}$ and $R_{i,j}$ are grayscale values of a first color sub-pixel and a second color sub-pixel of a dummy display pixel in an ith row and a jth column respectively, $G_{i+1,j}$ is a grayscale value of a first color sub-pixel of a dummy display pixel in an (i+1)th row and the jth column, $B_{i+2,j}$ is a grayscale value of a third color sub-pixel of a dummy display pixel in an (i+2)th row and the jth column, $G_{i+2,j}$ is a grayscale value of a first color sub-pixel of the dummy display pixel in the (i+2)th row and the jth column, $B_{i,j+2}$ is a grayscale value of a third color sub-pixel of a dummy display pixel in the ith row and a (j+2)th column, $G_{i+2,j+2}$ is a grayscale value of a first color sub-pixel of a dummy display pixel in the (i+2)th row and the (j+2)th column, $R_{i+2,j-2}$ is a grayscale value of a second color sub-pixel of a dummy display pixels of the (i+2)th row and a (j−2)th column, $g_{i,j}$ is a grayscale value of first color sub-pixels of a plurality of pixel repeat units in the ith row and the jth column, $g_{i+1,j}$ is a grayscale value of first color sub-pixels of a plurality of pixel repeat units in the (i+1)th row and the jth column, $r_{i,j-2}$ is a grayscale value of second color sub-pixels of a plurality of pixel repeat units in the ith row and the (i−2)th column, $r_{i,j}$ is a grayscale value of second color sub-pixels of a plurality of pixel repeat units in the ith row and the jth column, $b_{i,j+2}$ is a grayscale value of third color sub-pixels of a plurality of pixel repeat units in the ith row and the (j+2)th column, $b_{i+2,j}$ is a grayscale value of third color sub-pixels of a plurality of pixel repeat units in the (i+2)th row and the jth column, $g_{i+2,j}$ is a grayscale value of first color sub-pixels of a plurality of pixel repeat units in the (i+2)th row and the jth column, $g_{i+2,j+2}$ is a grayscale value of first color sub-pixels of a plurality of pixel repeat units in the (i+2)th row and the (i+2)th column, $b_{i-2,j}$ is a grayscale value of third color sub-pixels of a plurality of pixel repeat units in an (i−2)th row and the jth column, $r_{i-2,j}$ is a grayscale value of second color sub-pixels of a plurality of pixel repeat units in the (i−2)th row and the jth column, $r_{i+2,j-2}$ is a grayscale value of second color sub-pixels of a plurality of pixel repeat units in the (i+2)th row and the (j−2)th column, and $\gamma$ is a preset grayscale function.

2. The display driving method according to claim 1, wherein when the data signal is inputted to the at least two adjacent pixel rows corresponding to the target driving row, two adjacent dummy display pixels enabled in response to the row scanning signal in a pixel row direction share the second sub-pixel in the second color and the third sub-pixel in the third color in a same pixel repeat unit.

3. A display panel, configured to perform the display driving method according to claim 1, wherein the display panel comprises a first display region and a second display region, wherein the first display region is provided with a first pixel density, and the second display region is provided with a second pixel density smaller than the first pixel density;

each of the first display region and the second display region comprises a plurality of pixel repeat units, and each pixel repeat unit comprises a first sub-pixel in a first color, a second sub-pixel in a second color, a third sub-pixel in a third color and a fourth sub-pixel in the first color sequentially arranged along a first direction;

a light-emitting area of the first sub-pixel in the first color and a light-emitting area of the fourth sub-pixel in the first color are both smaller than a light-emitting area of the second sub-pixel in the second color and a light-emitting area of the third sub-pixel in the third color; and a dummy pixel space is formed in a second pixel row between a first pixel repeat unit in a first pixel row and a second pixel repeat unit in a third pixel row in three adjacent pixel rows at the second display region, an area of the dummy pixel space is at least greater than or equal to an area occupied by one pixel repeat unit, and a lengthwise extension direction of the pixel row is parallel to the first direction.

4. The display panel according to claim 3, wherein in three adjacent pixel repeat units at the first display region, the first sub-pixel in the first color of a second pixel repeat unit and the fourth sub-pixel in the first color of a first pixel repeat unit are arranged along a second direction, the fourth sub-pixel in the first color of the second pixel repeat unit and the first sub-pixel in the first color of a third pixel repeat unit are arranged along the second direction, the second direction is perpendicular to the first direction, and the first pixel repeat unit, the second pixel repeat unit and the third pixel repeat unit are sequentially arranged along the first direction.

5. The display panel according to claim 3, wherein a plurality of pixel repeat units is arranged in a staggered manner in two adjacent pixel rows at the second display region.

6. The display panel according to claim 3, wherein widths of the first sub-pixel, the second sub-pixel, the third sub-pixel and the fourth sub-pixel are all L in the first direction, a distance between two adjacent pixel repeat units in the first direction is an integral multiple of L in each pixel row at the second display region, and a distance between two adjacent pixel repeat units in the first direction is an integral multiple of 3 L in a second pixel row of three adjacent pixel rows at the second display region.

7. The display panel according to claim 3, wherein an orthogonal projection of the first pixel repeat unit onto the third pixel row at least partially overlaps the second pixel repeat unit.

8. The display panel according to claim 3, wherein a width of the first sub-pixel and a width of the fourth sub-pixel in the second direction are one half of a width of the second sub-pixel and a width of the third sub-pixel in the second direction respectively in each pixel repeat unit.

9. The display panel according to claim 8, wherein the first sub-pixel and the fourth sub-pixel of each pixel repeat unit are both arranged at a side adjacent to a first edge of the second display region coupled to the first display region, the second display region further comprises a second edge coupled to the first display region and arranged opposite to the first edge, and a direction from the first edge to the second edge is parallel to the second direction.

10. The display panel according to claim 3, wherein the sub-pixels in two adjacent pixel rows are arranged in a staggered manner at the first display region and the second display region.

11. The display panel according to claim 10, wherein the first sub-pixel in the first color of a fourth pixel repeat unit in a first pixel row of two adjacent pixel rows at the first display region is offset by 1.5 sub-pixels in the first direction relative to the first sub-pixel in the first color of a fifth pixel repeat unit in the second pixel row adjacent to the fourth pixel repeat unit.

12. The display panel according to claim 3, wherein in a plurality of pixel repeat units, the first sub-pixels and the fourth sub-pixels in a same pixel row are coupled to a first driving line, and the second sub-pixels and the third sub-pixels in a same pixel row are coupled to a second driving line adjacent to the first driving line.

13. The display panel according to claim 3, wherein the first color is green, the second color is red, and the third color is blue.

* * * * *